(12) United States Patent
Feustel et al.

(10) Patent No.: US 7,977,237 B2
(45) Date of Patent: Jul. 12, 2011

(54) FABRICATING VIAS OF DIFFERENT SIZE OF A SEMICONDUCTOR DEVICE BY SPLITTING THE VIA PATTERNING PROCESS

(75) Inventors: Frank Feustel, Dresden (DE); Thomas Werner, Moritzburg (DE); Kai Frohberg, Niederau (DE)

(73) Assignee: GLOBALFOUNDRIES Inc., Grand Cayman, Cayman Islands (KY)

( * ) Notice: Subject to any disclaimer, the term of this patent is extended or adjusted under 35 U.S.C. 154(b) by 0 days.

(21) Appl. No.: 12/894,648

(22) Filed: Sep. 30, 2010

(65) Prior Publication Data

US 2011/0104867 A1    May 5, 2011

(30) Foreign Application Priority Data

Oct. 30, 2009   (DE) .......................... 10 2009 046 242

(51) Int. Cl.
*H01L 21/4763* (2006.01)
*H01L 21/44* (2006.01)

(52) U.S. Cl. ........ 438/634; 438/637; 438/638; 438/672; 257/774; 257/E21.577; 257/E21.579; 257/E21.585

(58) Field of Classification Search .................. 438/629, 438/634, 637, 638, 640, 672, 717, 736
See application file for complete search history.

(56) References Cited

U.S. PATENT DOCUMENTS

2009/0197422 A1* 8/2009 Kang et al. .................... 438/717

* cited by examiner

*Primary Examiner* — Hsien-ming Lee
(74) *Attorney, Agent, or Firm* — Williams, Morgan & Amerson, P.C.

(57) ABSTRACT

When forming a complex metallization system in which vias of different lateral size have to be provided, a split patterning sequence may be applied. For this purpose, a lithography process may be specifically designed for the critical via openings and a subsequent second patterning process may be applied for forming the vias of increased lateral dimensions, while the critical vias are masked. In this manner, superior process conditions may be established for each of the patterning sequences.

20 Claims, 7 Drawing Sheets

FABRICATING VIAS OF DIFFERENT SIZE OF A SEMICONDUCTOR DEVICE BY SPLITTING THE VIA PATTERNING PROCESS

BACKGROUND OF THE INVENTION

1. Field of the Invention

Generally, the subject matter disclosed herein relates to integrated circuits, and, more particularly, to contact features for connecting contact areas or metal regions of semiconductor devices with conductive lines or regions, such as metal lines, in a higher wiring level of the semiconductor device.

2. Description of the Related Art

The fabrication of microstructures, such as integrated circuits, requires tiny regions of precisely controlled size to be formed in one or more material layers of an appropriate substrate, such as a silicon substrate, a silicon-on-insulator (SOI) substrate or other suitable carrier materials. These tiny regions of precisely controlled size are typically defined by patterning the material layer(s) by applying lithography, etch, implantation, deposition processes and the like, wherein, typically, at least in a certain stage of the patterning process, a mask layer may be formed over the material layer(s) to be treated to define these tiny regions. Generally, a mask layer may consist of or may be formed by means of a layer of photoresist that is patterned by a lithographic process, typically a photolithography process. During the photolithography process, the resist may be spin-coated onto the substrate surface and then selectively exposed to ultraviolet radiation through a corresponding lithography mask, such as a reticle, thereby imaging the reticle pattern into the resist layer to form a latent image therein. After developing the photoresist, depending on the type of resist, positive resist or negative resist, the exposed portions or the non-exposed portions are removed to form the required pattern in the layer of photoresist. Based on this resist pattern, actual device patterns may be formed by further manufacturing processes, such as etch, implantation, anneal processes and the like. Since the dimensions of the patterns in sophisticated integrated microstructure devices are steadily decreasing, the equipment used for patterning device features have to meet very stringent requirements with regard to resolution and overlay accuracy of the involved fabrication processes. In this respect, resolution is considered as a measure for specifying the consistent ability to print minimum size images under conditions of predefined manufacturing variations. One important factor in improving the resolution is the lithographic process, in which patterns contained in the photo mask or reticle are optically transferred to the substrate via an optical imaging system. Therefore, great efforts are made to steadily improve optical properties of the lithographic system, such as numerical aperture, depth of focus and wavelength of the light source used.

The resolution of the optical patterning process may, therefore, significantly depend on the imaging capability of the equipment used, the photoresist materials for the specified exposure wavelength and the target critical dimensions of the device features to be formed in the device level under consideration. For example, gate electrodes of field effect transistors, which represent an important component of modern logic devices, may have a length of 50 nm and less for currently produced devices, with significantly reduced dimensions for device generations that are currently under development. Similarly, the line width of metal lines provided in the plurality of wiring levels or metallization layers may also have to be adapted to the reduced feature sizes in the device layer in order to account for the increased packing density. Consequently, the actual feature dimensions may be well below the wavelength of currently used light sources provided in current lithography systems. For example, currently in critical lithography steps, an exposure wavelength of 193 nm may be used, which, therefore, may require complex techniques for finally obtaining resist features having dimensions well below the exposure wavelength. Thus, highly non-linear processes are typically used to obtain dimensions below the optical resolution. For example, extremely non-linear photo-resist materials may be used, in which a desired photochemical reaction may be initiated on the basis of a well-defined threshold so that weakly exposed areas may not substantially change at all, while areas having exceeded the threshold may exhibit a significant variation of their chemical stability with respect to a subsequent development process.

In particular, during the patterning of dielectric materials of metal systems of sophisticated semiconductor devices, precisely defined etch masks may be required in order to provide an appropriate template for etching through a moderately thick dielectric material, which may thus impose significant restrictions on the corresponding etch strategy. Consequently, any irregularities occurring during the complex lithography process may translate into even further increased irregularities after completing the complex etch process. Due to the complex interaction between the imaging system used during the lithography process, the resist material and the corresponding pattern provided on the lithography mask or reticle, typically, highly sophisticated imaging techniques, including optical proximity corrections (OPC), may be applied. In OPC strategies, very complex calculations are applied in order to predict the characteristics of latent images and resist features after imaging the pattern of the lithography mask into the photoresist layer. For this purpose, the specific conditions of the lithography process, such as exposure wavelength, resist material, critical dimensions of the circuit features and the like, may be entered into an appropriate model, which in turn may provide "modified" layouts for the individual circuit features, such as lines and the like, in order to avoid or at least reduce any undesired distortions of circuit features upon imaging the pattern from the photolithography mask into the resist material. Such OPC models may involve a plurality of parameters, wherein efficiency of the OPC model under consideration strongly depends on the range of many input parameters. That is, efficient OPC models may require a more or less restricted range of parameters, such as critical dimensions of circuit features for otherwise identical conditions. Consequently, when imaging circuit features, such as contact openings or via openings, into a resist material, wherein a significant difference in lateral dimensions is required, the OPC model may be less efficient and may thus result in lithography-related irregularities.

Furthermore, during the complex patterning process for forming metallization systems of semiconductor devices, frequently, a process strategy may be applied in which via openings and trenches may be formed in a patterning sequence and these openings may be filled in a common deposition process in order to enhance overall process efficiency. Since the via openings and the trenches may extend to a different depth in the dielectric material, i.e., the via openings may provide connection to a lower-lying metallization level, a patterning sequence is required in which different lithography processes may have to be performed on the basis of a pronounced surface topography, which may also contribute to further process irregularities, as will be described in more detail with reference to FIGS. 1a-1c.

FIG. 1a schematically illustrates a cross-sectional view of a semiconductor device 100 which comprises a substrate 101 above which are formed various levels, such as a level including semiconductor elements and the like, in combination with a metallization system 150. For convenience, circuit elements such as transistors, resistors and the like are not shown in FIG. 1a. In the example shown, the metallization system 150 comprises a first metallization layer 110 including an appropriate dielectric material 111 in combination with metal regions 112A, 112B. Furthermore, a cap layer or etch stop layer 113 is formed above the dielectric material 111 and the metal regions 112A, 112B. The dielectric material 111 may represent any appropriate material, such as silicon dioxide, low-k dielectric materials, which are to be understood as dielectric materials having a dielectric constant of 3.0 or less, and the like. Similarly, the metal regions 112A, 112B may comprise any appropriate conductive material, such as copper, in combination with conductive barrier materials and the like. Similarly, the etch stop layer 113 may typically be comprised of a silicon nitride-based material, such as a carbon-containing silicon nitride and the like. As previously explained, lateral dimensions of the metal regions 112A, 112B may be approximately 100 nm and less for critical circuit features, while, in the same device level, metal regions of significantly greater dimensions may also have to be provided. For instance, it may be assumed that the lateral dimensions of the metal region 112B may be at least twice the lateral dimensions of the metal region 112A.

Moreover, the metallization system 150 comprises a second metallization layer 120 which, in the manufacturing stage shown, comprises an appropriate dielectric material 121, such as a low-k dielectric material and the like. Furthermore, an etch mask 102 is formed above the dielectric material 121 and may comprise openings 102A, 102B which determine the lateral position and size of via openings to be formed in the dielectric material 121 so as to connect to the metal regions 112A, 112B. In the example shown, the mask openings 102A, 102B may be adapted to the size of the metal regions 112A, 112B, at least in one lateral direction, i.e., in FIG. 1a, in the horizontal direction, thereby also requiring the openings 102A, 102B to have significantly different lateral dimensions, as indicated by 103A, 103B.

The semiconductor device 100 as illustrated in FIG. 1a may be formed on the basis of any appropriate process strategy for providing semiconductor-based circuit elements in one or more semiconductor layers, followed by process techniques for forming the metallization system 150. For convenience, a corresponding process strategy will be explained with reference to the metallization layer 120, wherein it should be appreciated that similar process techniques may also be applied for forming the metallization layer 110. Thus, the dielectric material 121 may be formed on the cap layer or etch stop layer 113, which may be accomplished by any appropriate deposition technique such as chemical vapor deposition (CVD), spin-on techniques and the like. Thereafter, appropriate materials, such as anti-reflective coating (ARC) materials, hard mask materials and the like, may be deposited and may be used for the subsequent complex lithography process. As previously explained, during a lithography process, a desired pattern may be provided in a lithography mask and may be imaged into a resist layer (not shown) so as to form a latent image therein, wherein the characteristics of the imaging process may strongly depend on the type of resist material used, the exposure wavelength, the characteristics of the lithography equipment, for instance in terms of numerical aperture, depth of focus, and the like. Furthermore, as discussed above, the finally obtained result of the lithography process may also depend on the efficiency of optical proximity correction mechanisms that are based on appropriately selected input parameters and thus OPC models. For instance, if the lateral dimension 103A is to be considered as a critical dimension for the lithography process under consideration, corresponding OPC mechanisms may be triggered such that, preferably, the opening 102A with the critical dimension 103A may be obtained with a high degree of precision, thereby possibly negatively affecting the quality of the imaging process with respect to the opening 102B.

Based on a corresponding resist material, the etch mask 102 may be patterned and/or the resist material may also be used, possibly in combination with the additional materials, as the etch mask 102. Subsequently, a plasma assisted etch process is performed in which an appropriate etch chemistry is applied so as to etch through the semiconductor material 121, while a corresponding etch rate in the etch mask 102 is significantly less. For this purpose, a plurality of well-established etch recipes are available, wherein, however, the etch fidelity may depend on the quality of the etch mask 102 and any process variations during the sophisticated etch process. For instance, the local etch conditions, such as the presence of reactive components, polymer additives and the like, may vary, depending on the packing density of features and the size thereof. For example, due to the increased lateral dimension 103B, the local etch rate may be different in this area compared to the area corresponding to the opening 102A.

FIG. 1b schematically illustrates the semiconductor device 100 in a further advanced manufacturing stage in which via openings 121A and 121B are formed in the dielectric material 121 and the etch mask 102 (FIG. 1a) is removed. As illustrated, the openings 121A, 121B extend to the etch stop layer 113, wherein, depending on the local variation of the etch conditions, a more or less degree of material erosion may occur in the opening 121A, 121B.

FIG. 1c schematically illustrates the semiconductor device 100 in a further advanced manufacturing stage. As illustrated, an optical planarization layer (OPL) 103 is formed above the dielectric material 121 and within the openings 121A, 121B. The optical planarization material 103 is typically provided as an organic material that may be applied on the basis of spin-on techniques in a low viscous state, wherein superior gap fill capabilities of this material may result in the filling of the openings 121A, 121B, while also an additional material layer is formed above the dielectric material 121, which may thus be used as an ARC material, etch mask material and the like. Upon the continuous reduction of the overall feature sizes, however, the lateral dimensions of the via openings have reached values of 100 nm and even less so that the reliable filling of critical openings, such as the opening 121A, may become increasingly difficult. At the same time, the fill behavior in significantly greater openings, such as the opening 121B, may strongly differ to that of the critical opening 121A, thereby resulting in a pronounced surface topography of the layer 103 so that the "planarizing effect" of the material 103 may be significantly restricted by the presence of openings of very different lateral dimensions. Consequently, in a subsequent lithography process in which a further etch mask 104, such as a resist mask, is to be provided with corresponding openings 104A, 104B defining the lateral size and position of corresponding trenches, even further sophisticated conditions may be encountered. That is, due to the pronounced surface topography, corresponding variations of the exposure process may occur, for instance, due to the very restricted depth of focus and the like. Furthermore, during the subsequent etch process for patterning the planarization material 103 and etching into the dielectric material 121 so as to form corresponding trenches 121C, 121D therein, further process irregularities may occur due to imperfections of the etch mask 104 caused by lithography irregularities and due to etch variations caused by the pronounced surface topography.

Consequently, upon the further processing, i.e., the filling of trenches 121C, 121D and the via openings 121A, 121B with a conductive material, such as copper and the like, significant variations of the resulting metal features may be observed which may, however, contribute to significantly increased yield losses.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques in which openings in a dielectric material of a semiconductor device may be provided with different lateral dimensions by splitting the corresponding lithography process into two lithography steps, thereby enabling a desired adaptation of each of the lithography steps to the specific process conditions for the different critical dimensions. For instance, appropriate OPC models for designing and fabricating the corresponding lithography masks may be specifically applied for each lithography step, thereby enhancing accuracy and reliability of the entire patterning process. In other cases, even different resist materials and/or exposure wavelengths may be used in the split lithography sequence, thereby providing a high degree of flexibility in appropriately adjusting the overall process conditions. Consequently, openings of even very differing lateral dimensions may be provided in the same metallization level or contact level without deteriorating the result of the entire patterning sequence.

One illustrative method disclosed herein comprises forming a first opening in a dielectric material layer of a metallization layer of a semiconductor device. The first opening has a first critical lateral dimension along a first lateral direction and extends to an etch stop layer that is formed below the dielectric material layer. The method further comprises forming a first part of a second opening in the dielectric material layer while masking the first opening, wherein the second opening has a second critical lateral dimension along the first lateral direction which is at least twice the first critical lateral dimension. Additionally, the method comprises concurrently forming a first trench around the first opening, a second trench around the first part of the second opening and a second part of the second opening so as to extend to the etch stop layer. Furthermore, the first and second trenches and the first and second openings are filled with a conductive material.

Another illustrative method disclosed herein relates to forming vias of different lateral size in a semiconductor device. The method comprises forming a first via opening in a dielectric material of a metallization layer, wherein the first via opening extends to an etch stop layer that is formed below the dielectric material. The method further comprises forming a second via opening in the dielectric material after forming the first via opening, wherein the second via opening terminates in the dielectric material. The method additionally comprises forming an etch mask above the dielectric material which determines a lateral position and size of the first trench that accommodates the first via opening and which determines a lateral position and size of a second trench that accommodates the second via opening. Furthermore, the method comprises forming the first trench and the second trench on the basis of the etch mask and increasing a depth of the first and second via openings so as to extend through the etch stop layer. Finally, the method comprises filling a conductive material in the first and second trenches and the first and second via openings.

A still further illustrative method disclosed herein relates to forming contact elements for connecting different levels of a semiconductor device. The method comprises forming a first etch mask above a dielectric material by performing a first lithography process by using a first lithography mask. The method further comprises forming a first opening in the dielectric material by using the first etch mask, wherein the first opening extends through the dielectric material. The method further comprises forming a second etch mask above the dielectric material that includes the first opening by performing a second lithography process using a second lithography mask. The first and second lithography processes differ in at least one of an exposure wavelength, an optical proximity correction model used to design the first and second lithography masks and in a type of resist material. Additionally, the method comprises forming a second opening on the basis of the second etch mask, wherein the second opening extends into the dielectric material and terminates therein. Moreover, a third etch mask is formed above the dielectric material that includes the first and second openings. Additionally, the method comprises forming a first trench above the first opening and a second trench above the second opening on the basis of the third etch mask while increasing a depth of the second opening so as to extend through the dielectric material. Additionally, the method comprises filling the first and second trenches and the first and second openings with a conductive material.

BRIEF DESCRIPTION OF THE DRAWINGS

The disclosure may be understood by reference to the following description taken in conjunction with the accompanying drawings, in which like reference numerals identify like elements, and in which.

Figure 1A:
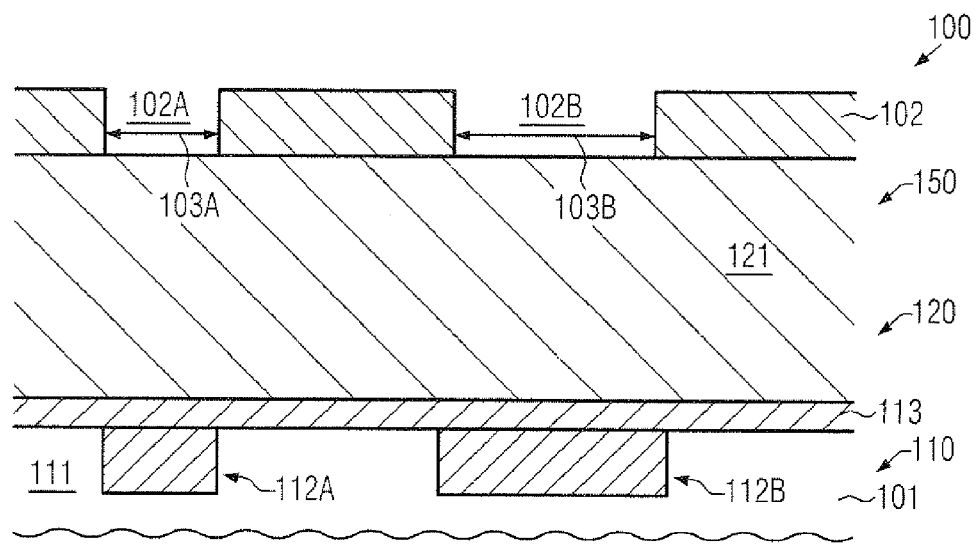
FIGS. 1a-1c schematically illustrate cross-sectional views of a semiconductor device in various manufacturing stages when forming vias of different lateral size, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides manufacturing techniques in which openings in a dielectric material with significantly different lateral dimensions may be provided, in particular in the metallization system of sophisticated semiconductor devices, by applying different lithography processes for the vias of different lateral size. As explained above, in sophisticated circuit layouts of semiconductor devices, critical vias may have to connect to conductive regions or metal regions of lateral dimensions of approximately 200 nm and less or 100 nm and less, thereby requiring appropriately adapted contact elements or vias. On the other hand, the layout may require the provision of vias of significantly increased lateral dimensions, which is to be understood as a lateral dimension that is at least twice the lateral dimension of the critical vias, which may result in extremely sophisticated process conditions, as previously explained with reference to FIGS. 1a-1c. Furthermore, very large metal regions may have to be provided, for instance in the form of test areas, metal regions for enhancing the overall mechanical stability, such as "crack stops," and the like. Based on the principles disclosed herein, at least the most critical vias may be patterned on the basis of a dedicated lithography process and a corresponding etch process, thereby enhancing process uniformity and thus reliability of the resulting metallization system. On the other hand, the openings of increased lateral dimensions may be obtained on the basis of a specifically designed lithography process with a subsequent etch process in which, in some illustrative embodiments, these openings may be formed so as to extend to a desired depth. Consequently, during a subsequent planarization process, less sophisticated process conditions may be provided, thereby obtaining a reliable fill of the partially formed via opening of increased lateral dimension. During the further processing, appropriate trenches may be formed while at the same time completing the opening of increased lateral dimension, substantially without affecting the previously patterned via opening of reduced lateral dimension.

Consequently, by splitting the patterning process, the regular via openings or contact openings may be formed with high precision without being influenced by the presence of openings of significantly greater lateral dimensions. This may be accomplished by using OPC models and/or an appropriate exposure wavelength and/or an appropriate resist material, thereby providing a high degree of flexibility in selecting superior process conditions. Similarly, appropriate process conditions may be selected for the subsequent lithography process for forming an etch mask for the openings of increased lateral dimension, while at the same time providing superior conditions for the application of a corresponding planarization material.

Figure 1B:
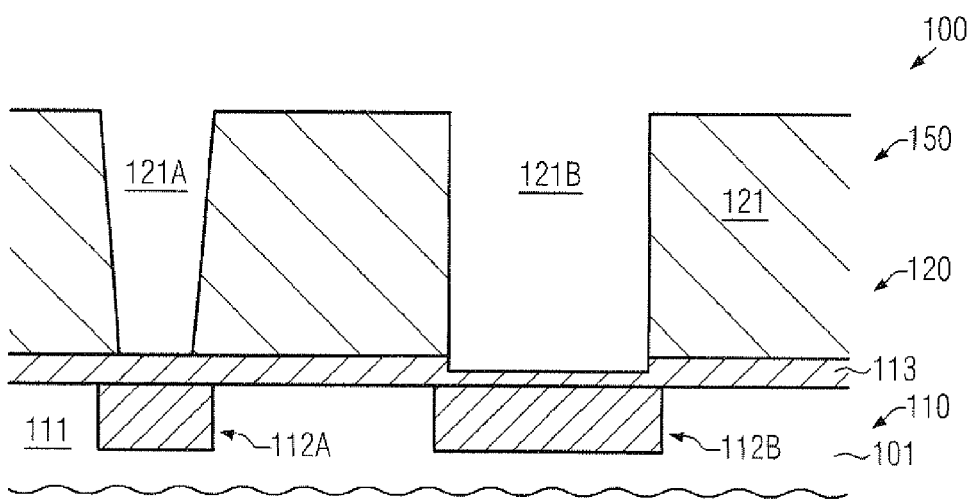
Figure 1C:
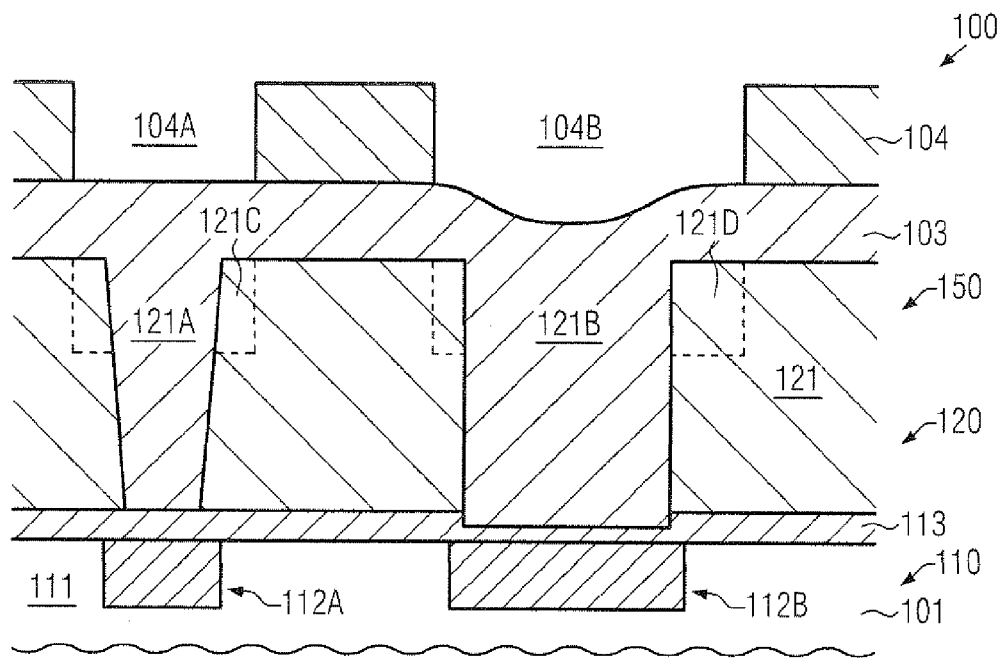

With reference to FIGS. 2a-2k, further illustrative embodiments will now be described, wherein reference may also be made to FIGS. 1a-1c, if appropriate.

Figure 2A:
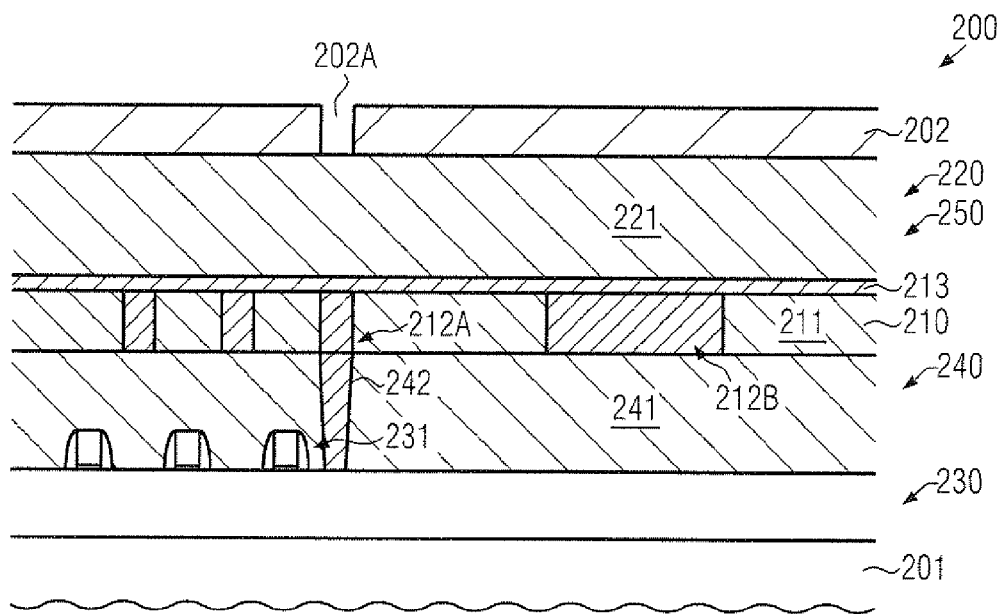
FIG. 2a schematically illustrates a cross-sectional view of a semiconductor device in a manufacturing stage for forming a critical via opening, according to illustrative embodiments.

FIG. 2a schematically illustrates a cross-sectional view of a semiconductor device 200 comprising a substrate 201 above which may be provided several levels 230, 240, 250 and the like. The substrate 201 may represent any appropriate carrier material, such as a silicon material, an insulating material and the like. The level 230 may comprise a semiconductor material, such as a silicon material, in and above which circuit elements 231 may be formed. For example, the circuit elements 231 may comprise field effect transistors having components, such as a gate electrode structure, with critical dimensions of 50 nm and less. The level 240 may represent a contact level of the device 200 which may be understood as an "interface" which may connect the circuit elements 231 to the level 250, which may represent the metallization system of the semiconductor device 200. The contact level 240 may comprise any appropriate dielectric material 241, such as silicon nitride, silicon dioxide and the like, in which contact elements 242 may be formed so as to connect to contact regions of the circuit elements 231. Furthermore, the contact elements 242 may connect to one or more metal regions 212A of a metallization layer 210 of the metallization system 250. Furthermore, the metallization layer 210 may, if required, comprise metal regions 212B having significantly different lateral dimensions compared to the metal regions 212A. Furthermore, an etch stop layer 213 may be provided above the metal regions 212A, 212B and a dielectric material 211 of the metallization layer 210. Furthermore, in the manufacturing stage shown, a further metallization layer 220 may be provided which, in the manufacturing stage shown, may be represented by a dielectric material 221 of any appropriate composition. Furthermore, an etch mask 202 may be provided above the dielectric material 221 and may comprise a mask opening 202A, which defines the lateral position and size of an opening to be formed in the dielectric material 221 and finally in the etch stop layer 213 so as to connect to one of the metal regions 212A. As previously discussed, the critical dimensions of corresponding vias or contact elements connecting the different device levels may have to be adapted to the overall reduced feature sizes of other circuit elements, such as the circuit elements 231, the metal regions 212A and the like. For example, the lateral size of the opening 202A in both lateral directions, i.e., in the horizontal direction of FIG. 2a, and in a direction perpendicular to the drawing plane of FIG. 2a, may be on the order of magnitude of 200 nm and less or even 100 nm and less, depending on the dimensions of the metal regions 212A.

The semiconductor device 200 as illustrated in FIG. 2a may be formed on the basis of the following processes. The circuit elements 231 in and on the device level 230 may be fabricated by applying any appropriate process strategy as required in accordance with the design rules and device requirements. Thereafter, the contact level 240 may be formed by depositing the dielectric material 241 and patterning the same so as to form respective openings, which are finally filled with a conductive material so as to obtain the contact element 242. Thereafter, the metallization layer 210 may be formed, for instance, by depositing the dielectric material 211 and patterning the same on the basis of well-established process strategies. Thereafter, corresponding openings may be filled with any appropriate conductive material, such as copper and the like, possibly in combination with conductive barrier materials, so as to obtain the metal regions 212A, 212B after the removal of any excess metal material. Next, the etch stop material 213 may be deposited, for instance, by CVD and the like. It should be appreciated that the metallization layer 210 and the contact level 240, or at least a portion thereof, may also be formed on the basis of process techniques as will be described later on with respect to the metallization layer 220. In this case, at least a portion of the contact elements 242 and the metal regions 212A, 212B may be formed on the basis of the same conductive material and similar patterning strategies may be applied when contact elements of significantly different lateral size are to be applied in the contact level 240.

Thereafter, the dielectric material 221 may be deposited, possibly in combination with any appropriate materials, such as ARC materials, hard mask materials and the like, in order to perform a sophisticated lithography process to provide the etch mask 202 having the critical opening 202A formed therein. For this purpose, typically, a resist material (not shown in FIG. 2a) may be provided and may be lithographically patterned so as to obtain a mask, which may be used for providing the etch mask 202, or which may itself be used as an etch mask material.

Figure 2B:
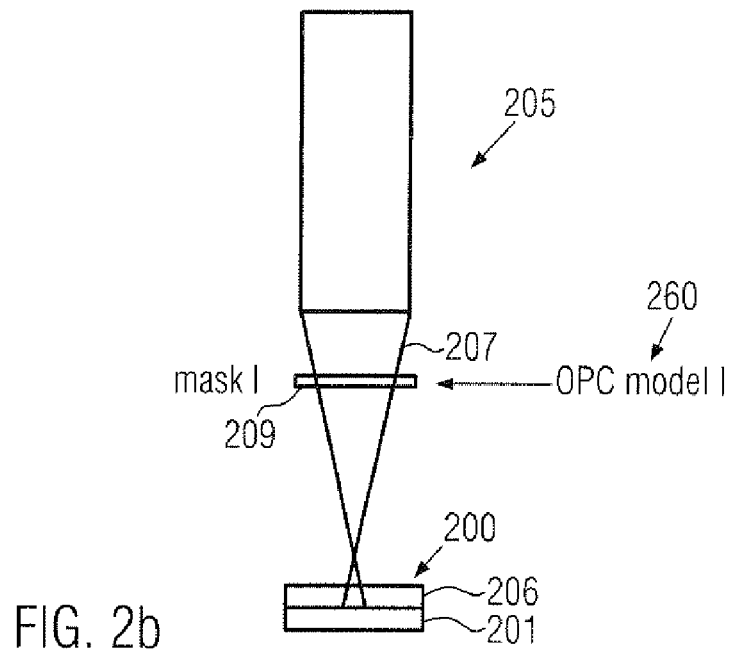
FIG. 2b schematically illustrates a lithography process used for forming the critical via, according to illustrative embodiments.

FIG. 2b schematically illustrates the device 200 during a lithography process 205. As illustrated, a lithography tool 207 in combination with a lithography mask 209 may be used so as to image a pattern contained in the lithography mask 209 into a resist layer 206, as is also previously explained. During the exposure process 205, a specific resist material may be used for the resist layer 206 that is appropriate to an exposure wavelength used in the lithography tool 207. Furthermore, the lithography mask, which may contain an appropriate pattern for generating the opening 202A (FIG. 2a) may be designed and may be fabricated on the basis of an OPC model 260, which may specifically take into consideration the process conditions during the lithography process 205. That is, among other things, the required critical dimensions of the opening 202A in combination with the exposure wavelength, the resist material and the like may be entered into the model 260 in order to enhance performance of the process 205. Consequently, after exposing the resist material 206 and developing the same, the etch mask 202 of FIG. 2a may be obtained, possibly in combination with any additional material that may provide the desired etch resistivity during the subsequent patterning of the dielectric material 221 of FIG. 2a.

Figure 2C:
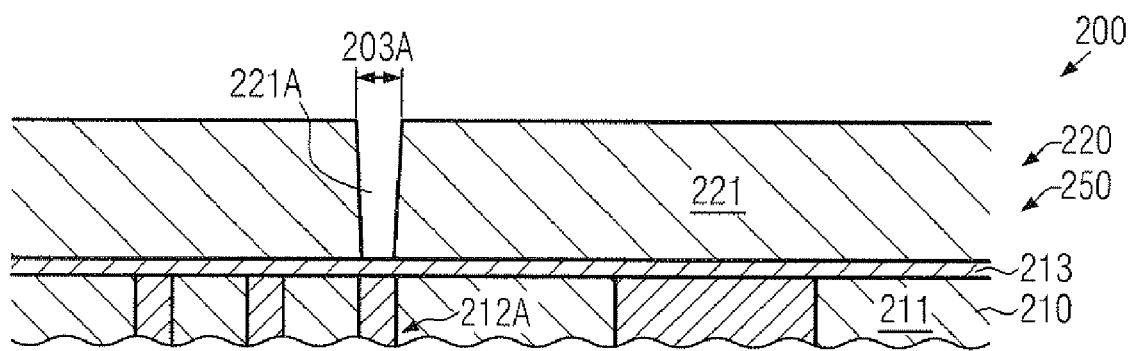
FIGS. 2c-2d schematically illustrate cross-sectional views of the semiconductor device in further advanced manufacturing stages in order to provide a second etch mask for defining a via of increased lateral dimensions, according to illustrative embodiments.

FIG. 2c schematically illustrates the semiconductor device 200 in a further advanced manufacturing stage. For convenience, only a portion of the metallization system 250 is illustrated in FIG. 2c. As shown, an opening, which may also be referred to as via opening 221A, may be formed in the dielectric material 221 so as to extend to the etch stop layer 213. The opening 221A may have a lateral critical dimension 203A in a specified lateral direction, for instance in FIG. 2c the horizontal direction, so as to comply with the overall design criteria. The opening 221A may be formed on the basis of well-established anisotropic etch techniques, as previously explained with reference to the device 100, wherein, however, compared to the conventional strategy, the etch mask 202 of FIG. 2a may be provided with superior precision and uniformity. Furthermore, a less pronounced difference in etch conditions may result in a superior uniformity of the process result since, for instance, a corresponding significant variation of etch rate across the entire substrate may be significantly less compared to the conventional strategy. Hence, undue exposure to the reactive atmosphere and the like may be reduced compared to the conventional approaches.

Figure 2D:
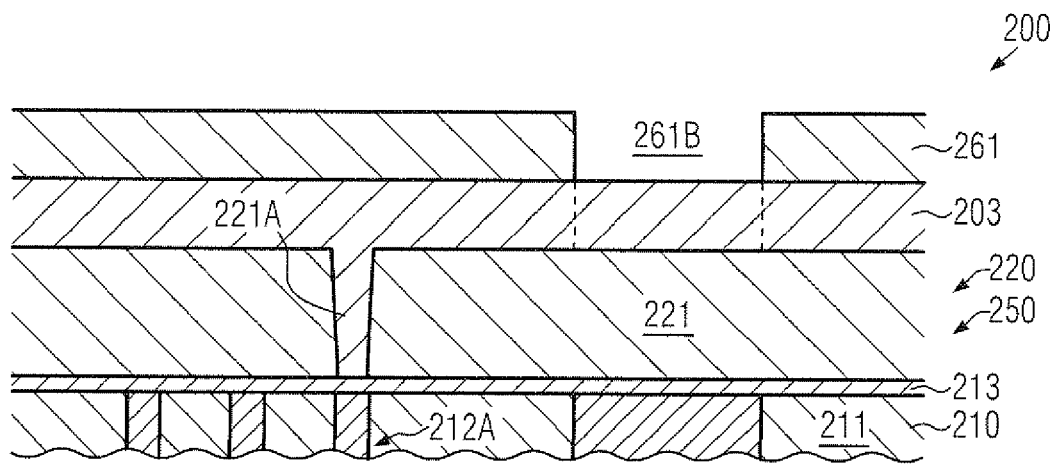

FIG. 2d schematically illustrates the semiconductor device 200 in a further advanced manufacturing stage. As illustrated, a planarization material 203 may be formed above the dielectric material 221 and within the opening 221A. Furthermore, an etch mask 261, such as a resist material, may be formed above the planarization material 203 and may comprise an opening 261B that substantially corresponds to a further opening to be formed in the dielectric material 221. Consequently, the opening 261B may have significantly greater lateral dimensions, at least in one lateral direction, compared to the opening 221A, as previously explained. The planarization material 203 may be provided on the basis of any appropriate technique, such as spin coating and the like, wherein a pronounced difference in surface topography with respect to any openings may be avoided, thereby providing superior planarity of the material 203. Thereafter, the layer 261 may be applied, for instance in the form of a resist material, which may be accomplished on the basis of any appropriate process technique. Thereafter, the layer 261 may be patterned by lithography so as to obtain the opening 261B, which in turn may be used to pattern the layer 203, as indicated by the dashed lines.

Figure 2E:
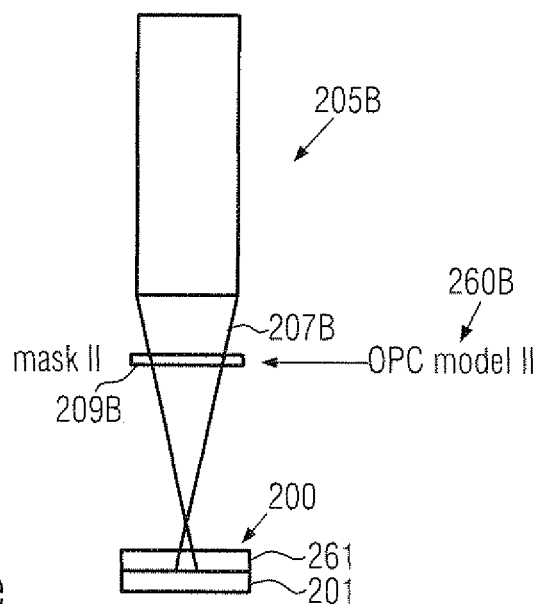
FIG. 2e schematically illustrates a further lithography process for providing the etch mask of FIG. 2d, according to illustrative embodiments.

FIG. 2e schematically illustrates a further lithography process 205B in order to pattern the layer 261. For this purpose, an exposure tool 207B may be used in combination with a lithography mask 209B which contains the device pattern for forming the opening 261B of FIG. 2d. Furthermore, the lithography mask 209B may be designed and fabricated on the basis of patterns obtained by an OPC model 260B. It should be appreciated that the lithography processes 205, 205B may, in some illustrative embodiments, differ in at least one of the following parameters: exposure wavelength, OPC model, type of resist material. Thus, a high degree of flexibility in specifically selecting process conditions during the lithography processes 205, 205B may be accomplished by appropriately splitting the process for forming differently sized openings in the dielectric material 221 (FIG. 2d). It should be appreciated that the lithography processes 205, 205B may even differ in each of these parameters, such as exposure wavelength and type of resist material and OPC model, if desired.

Figure 2F:
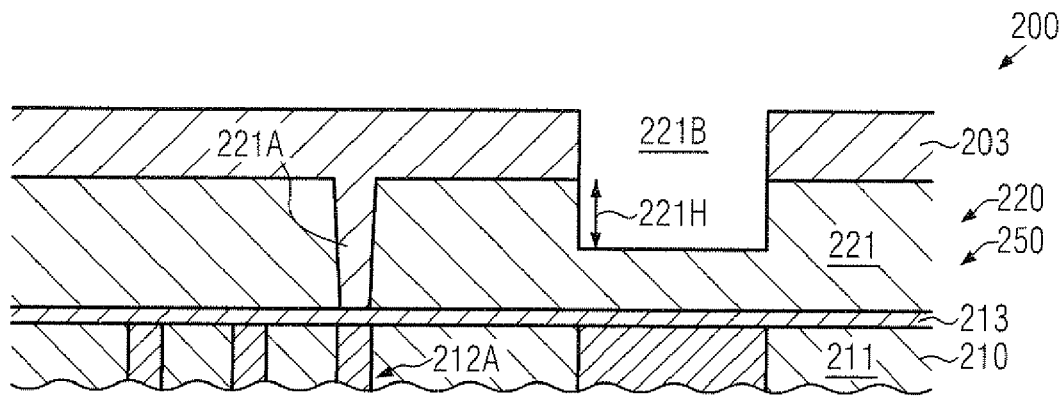
FIGS. 2f-2k schematically illustrate cross-sectional views of the semiconductor device during various manufacturing stages in forming trenches connecting to the vias of different lateral size and filling the trenches and via openings, according to illustrative embodiments.

FIG. 2f schematically illustrates the semiconductor device 200 in a further advanced manufacturing stage in which an opening 221B may be formed in an upper portion of the dielectric material 221. That is, in this manufacturing stage, the opening 221B may extend to a depth 221H and may thus terminate within the dielectric material 221. For example, the opening 221B, i.e., the first part corresponding to the depth 221H, extends to approximately half of the thickness of the dielectric material 221. For this purpose, any appropriate etch recipe may be applied wherein superior process uniformity may be accomplished due to the superior configuration of the etch mask 261 (FIG. 2d) and due to the superior uniformity of the etch process itself due to the absence of any openings of significantly reduced lateral dimensions.

Figure 2G:
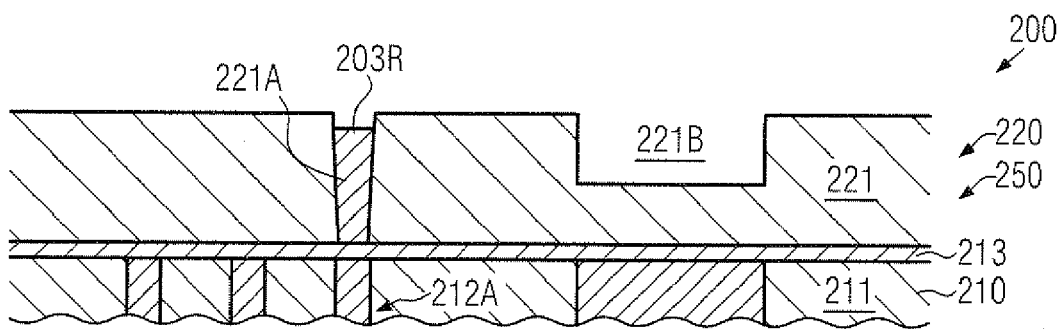

FIG. 2g schematically illustrates the semiconductor device in a further advanced stage in which the planarization material 203 (FIG. 2f) is removed from above the dielectric material 221, while a portion 203R is preserved in the opening 221A. For this purpose, any appropriate material removal process, such as an etch process, may be applied in which material of the layer 203 may be removed selectively with respect to the material 221.

Figure 2H:
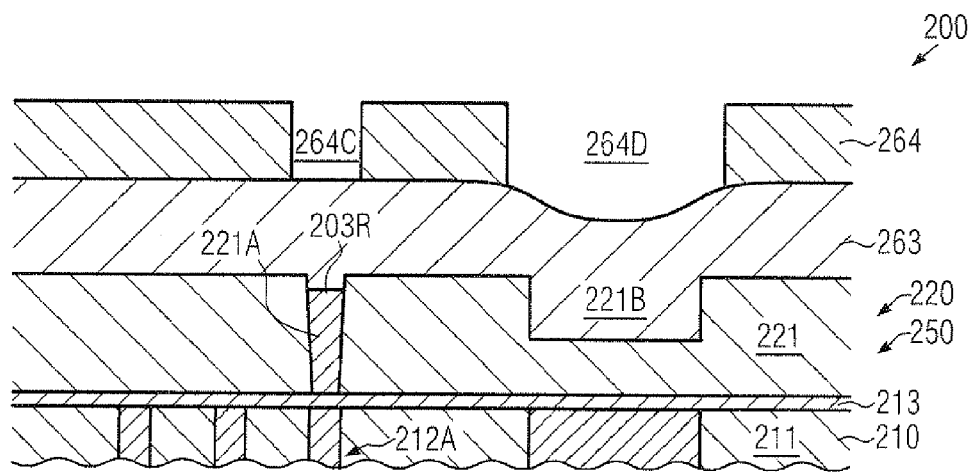

FIG. 2h schematically illustrates the semiconductor device 200 with a further planarization material 263 formed above the dielectric material 221 and within the opening 221B. Furthermore, the planarization material 263 may be formed on the residual planarization material 203R within the opening 221A. Additionally, a further etch mask 264, such as a resist mask and the like, may be formed above the planarization material 263 and may comprise openings 264C, 264D, which may determine the lateral position and size of corresponding trenches to be formed in the dielectric material 221 so as to accommodate the openings 221A, 221B. The planarization material 263 may be applied with superior uniformity since openings of significantly different lateral sizes may not be present. Furthermore, the opening 221B, contrary to conventional approaches, has a reduced depth, thereby also enhancing the overall process uniformity during the application of the planarization material 263. Consequently, the etch mask 264 may also be provided with superior uniformity since a corresponding lithography process may be performed on the basis of superior process conditions.

Figure 2I:
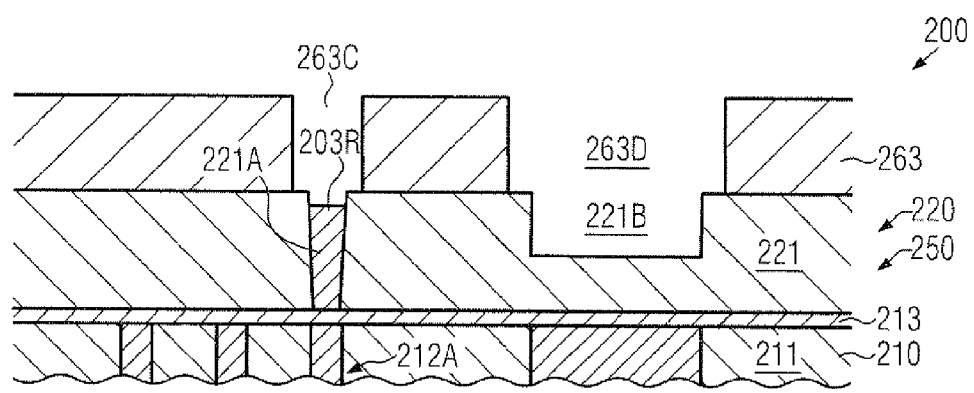

FIG. 2i schematically illustrates the semiconductor device 200 after the patterning of the planarization material 263, thereby forming corresponding openings 263C, 263D that may connect to the openings 221A, 221B, respectively. It should be appreciated that the etch mask 264 (FIG. 2h) may be removed or may be consumed during the corresponding etch process, while in other cases a portion of the etch mask 264 may still be present (not shown), depending on the overall process strategy. On the basis of at least the patterned planarization material 263, a further etch process may be performed in which corresponding trenches may be obtained so as to surround the openings 221A, 221B, respectively, while at the same time a depth of the opening 221B may be increased. On the other hand, a part of the material 203R may still be present in the opening 221A, thereby preserving integrity of at least the lower part of the opening 221A and of the etch stop layer 213.

Figure 2J:
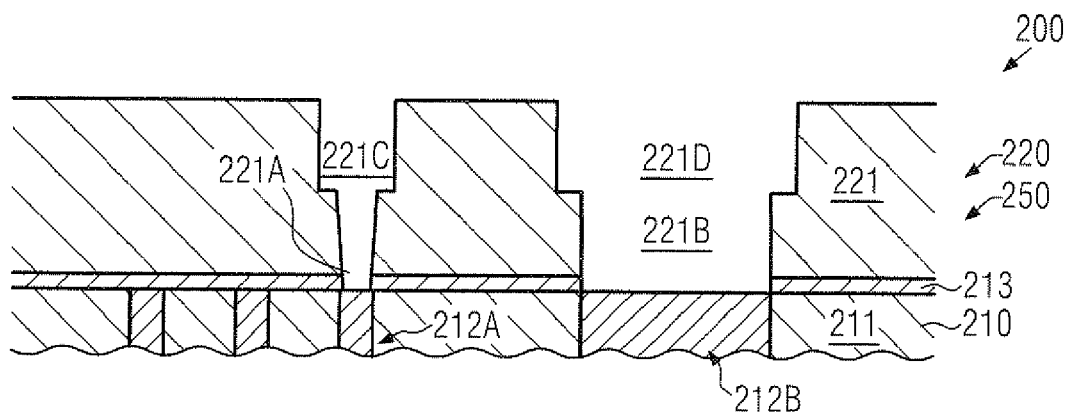

FIG. 2j schematically illustrates the semiconductor device 200 with a trench 221C formed above and in connection to the opening 221A and with a trench 221D formed above and in connection to the opening 221B. As explained above, the trenches 221C, 221D may be concurrently formed on the basis of any appropriate process strategy, while at the same time the opening 221B may be formed so as to extend down to the etch stop layer 213. Thereafter, the planarization material 263 (FIG. 2i) and residues of the material 203R (FIG. 2i) may be removed on the basis of any appropriate etch recipes, such as plasma ashing and the like. It should be appreciated that, during this process, any resist residues, if still present, may also be removed. Thereafter, a further etch step may be performed to etch through the etch stop layer 213, thereby connecting the opening 221C with the metal region 212A and the opening 221B with the metal region 212B. Thereafter, the trenches 221C, 221D and the via openings 221A, 221B may be filled with any appropriate conductive material, such as a conductive barrier material in combination with a metal, such as copper and the like. For this purpose, any well-established deposition techniques, such as CVD, sputter deposition, electroless plating and the like, may be applied for forming a barrier material, possibly in combination with a seed material, while the actual metal may be deposited by electrochemical deposition techniques. Thereafter, any excess material may be removed by any appropriate planarization technique, such as chemical mechanical polishing (CMP), electro CMP, electro etching and the like.

Figure 2K:
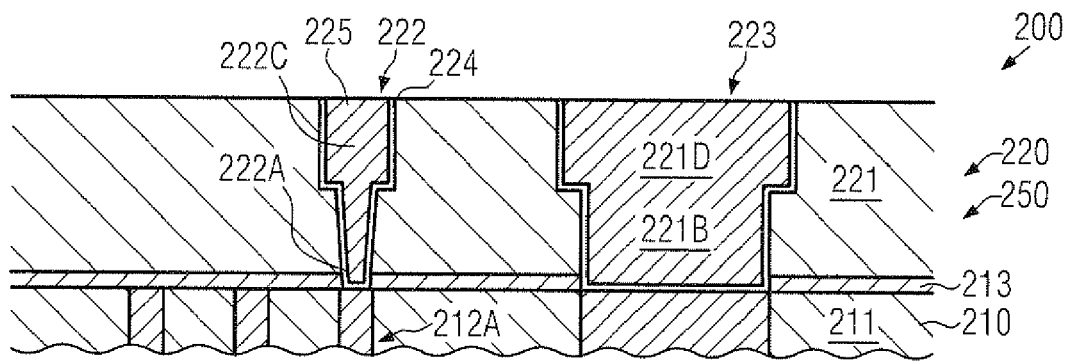

FIG. 2k schematically illustrates the semiconductor device 200 after the above-described process sequence. As illustrated, the device 200 may comprise metal regions 222 and 223, which may comprise a conductive barrier material 224 in combination with a highly conductive metal 225. The metal region 222 may comprise a trench 222C formed above and in contact with a via 222A, which may have the desired lateral dimensions so as to connect to the metal region 212A. On the other hand, the metal region 223 may comprise a trench 221D formed above and in connection to a via 221B having the desired increased lateral dimensions.

As a result, the present disclosure provides manufacturing techniques in which a split lithography and patterning process for forming contact openings of very different size may provide superior process conditions and thus enhanced reliability and performance of the resulting metallization system.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a first opening in a dielectric material layer of a metallization layer of a semiconductor device, said first opening having a first lateral critical dimension along a first lateral direction, said first opening extending to an etch stop layer formed below said dielectric material layer;
    forming a first part of a second opening in said dielectric material layer while masking said first opening, said second opening having a second lateral critical dimension along said first lateral direction, said second critical lateral dimension being at least twice said first critical lateral dimension;
    concurrently forming a first trench above and connecting to said first opening, a second trench above and connecting to said second opening and a second part of said second opening; and
    filling said first and second trenches and said first and second openings with a conductive material.

2. The method of claim 1, wherein forming a first part of said second opening comprises applying a planarization material above said dielectric material layer so as to fill said first opening, patterning said planarization material and using said patterned planarization material as an etch mask for forming said first part.

3. The method of claim 2, further comprising removing said planarization material from above said dielectric material layer and preserving a portion of said planarization material in said first opening.

4. The method of claim 3, wherein concurrently forming a first trench above and connecting said first opening, a second trench above and connecting to said first part of said second opening and a second part of said second opening comprises applying a second planarization material, patterning said second planarization material and using said patterned second planarization material as a trench etch mask.

5. The method of claim 1, wherein said first critical lateral dimension is approximately 200 nm or less.

6. The method of claim 1, wherein forming said first opening comprises performing a first lithography process using a first type of resist material and wherein forming said first part of said second opening comprises performing a second lithography process using a second type of resist material, wherein said first and second lithography processes differ in at least one of an exposure wavelength and type of resist material.

7. The method of claim 6, further comprising using a first optical proximity model for a first lithography mask used in said first lithography process and using a second optical proximity model for a second lithography mask used in said second lithography process, wherein said first optical proximity model differs from said second optical proximity model.

8. A method of forming vias of different lateral size in a semiconductor device, the method comprising:
    forming a first via opening in a dielectric material of a metallization layer, said first via opening extending to an etch stop layer formed below said dielectric material;
    after forming said first via opening, forming a second via opening in said dielectric material, said second via opening terminating in said dielectric material;
    forming an etch mask above said dielectric material, said etch mask determining a lateral position and size of a first trench that accommodates said first via opening and a lateral position and size of a second trench that accommodates said second via opening;
    forming said first trench and second trench on the basis of said etch mask and increasing a depth of said first and second via openings so as to extend through said etch stop layer; and
    filling a conductive material in said first and second trenches and said first and second via openings.

9. The method of claim 8, wherein forming said first via opening comprises performing a first lithography process and wherein forming said second via opening comprises performing a second lithography process and wherein said first and second lithography processes are performed on the basis of different exposure wavelengths.

10. The method of claim 8, wherein forming said first via opening comprises performing a first lithography process using a first lithography mask and wherein forming said second via opening comprises performing a second lithography process using a second lithography mask, wherein said first and second lithography masks are formed on the basis of different optical proximity models.

11. The method of claim 8, wherein forming said first via opening comprises performing a first lithography process and wherein forming said second via opening comprises performing a second lithography process and wherein said first and second lithography processes are performed on the basis of different resist materials.

12. The method of claim 8, wherein forming said second via opening comprises applying a planarization material so as to fill said first via opening, patterning said planarization material and using said patterned planarization material as an etch mask for said second via opening.

13. The method of claim 12, further comprising removing said patterned planarization material from above said dielectric material and preserving a portion of said planarization material in said first via opening.

14. The method of claim 13, wherein forming said etch mask comprises applying a second planarization material in the presence of said portion of said planarization material in said first via opening and patterning said second planarization material to provide said etch mask.

15. The method of claim 8, wherein said first via opening has a first lateral critical dimension along a first lateral direction and said second via opening has a second lateral critical dimension along said first lateral direction and wherein said second lateral critical dimension is at least twice said first lateral critical dimension.

16. The method of claim 15, wherein said first lateral critical dimension is approximately 200 nm or less.

17. A method of forming contact elements for connecting different levels of a semiconductor device, the method comprising:
    forming a first etch mask above a dielectric material by performing a first lithography process using a first lithography mask;
    forming a first opening in said dielectric material by using said first etch mask, said first opening extending through said dielectric material;
    forming a second etch mask above said dielectric material including said first opening by performing a second lithography process using a second lithography mask, said first and second lithography processes differing in at least one of an exposure wavelength, an optical proximity correction model used to design said first and second lithography masks and a type of resist material;
    forming a second opening on the basis of said second etch mask, said second opening extending into said dielectric material and terminating in said dielectric material;
    forming a third etch mask above said dielectric material including said first and second openings;
    forming a first trench above said first opening and a second trench above said second opening on the basis of said third etch mask while increasing a depth of said second opening so as to extend through said dielectric material; and
    filling said first and second trenches and said first and second openings with a conductive material.

18. The method of claim 17, wherein said first opening has a first lateral critical dimension along a first lateral direction and said second opening has a second lateral critical dimension along said first lateral direction and wherein said second lateral critical dimension is at least twice said first lateral critical dimension.

19. The method of claim 17, wherein forming said second etch mask comprises applying a planarization material above said dielectric material and in said first opening and patterning said planarization material.

20. The method of claim 19, wherein forming said third etch mask comprises removing said planarization material from above said dielectric material while preserving a portion of said planarization material in said first opening, applying a second planarization material and patterning said second planarization material.

* * * * *